(12) United States Patent
Mattisson

(10) Patent No.: US 6,335,659 B1
(45) Date of Patent: Jan. 1, 2002

(54) DEMODULATOR CIRCUITS

(75) Inventor: Sven Mattisson, Bjärred (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/274,327

(22) Filed: Mar. 23, 1999

(30) Foreign Application Priority Data

Mar. 24, 1998 (GB) .............................................. 9806206

(51) Int. Cl.[7] .................................................. H03D 3/02
(52) U.S. Cl. ...................................... 329/336; 329/337
(58) Field of Search ............................... 455/323, 326, 455/334, 214, 341, 337; 329/337, 336, 327

(56) References Cited

U.S. PATENT DOCUMENTS

| | | | | |
|---|---|---|---|---|
| 3,921,102 A | * | 11/1975 | Voorman ..................... 332/102 |
| 4,054,840 A | * | 10/1977 | Sato ........................... 329/337 |
| 5,302,910 A | | 4/1994 | Kondo et al. ................ 329/336 |
| 5,371,475 A | * | 12/1994 | Brown ........................ 330/254 |
| 5,372,475 A | * | 12/1994 | Brown ........................ 330/254 |
| 5,489,873 A | | 2/1996 | Kamata et al. ............. 327/558 |

FOREIGN PATENT DOCUMENTS

| | | | |
|---|---|---|---|
| EP | 0778667 A1 | 6/1997 | .................. 329/337 |
| GB | 2139681 A | 5/1998 | .................. 329/318 |

OTHER PUBLICATIONS

INSPEC abstract of Journal article: "A video and sound IF processing IC with automatic tuning loops" by Takahashi et al. in IEEE Transactions on Consumer Electronics vol. 40, No. 3, p299–305, Aug. 1994, USA.

* cited by examiner

Primary Examiner—Robert Pascal
Assistant Examiner—Kimberly E Glenn
(74) Attorney, Agent, or Firm—Burns, Doane, Swecker & Mathis, L.L.P.

(57) ABSTRACT

A frequency modulated signal demodulator circuit includes a phase shift element and a time delay element which operate on an input signal (V_IF). The phase shift element and the time delay element are provided by a gyrator component (14, 16, 20).

8 Claims, 2 Drawing Sheets

DEMODULATOR CIRCUITS

The present invention relates to demodulator circuits for demodulating frequency modulated (FM) signals.

DESCRIPTION OF THE RELATED ART

Referring to FIG. 1 of the accompanying drawings, a frequency modulated radio frequency (RF) signal is conventionally received by a receiver 1 from an antenna 2, and processed by the receiver 1 to produce an FM signal at a intermediate frequency which is lower than the RF carrier frequency. The IF modulated signal is then filtered by an IF band pass filter 4 and amplitude limited to a constant amplitude by a hard limiter 5. The constant amplitude signal is then fed to a detector 6 for demodulation by multiplying the signal by its time derivative. This operation makes the product amplitude proportional to both the signal's amplitude and angular frequency (intermediate frequency IF plus FM frequency deviation). Since the FM IF signal has a constant amplitude, due to the hard limiter 5, the product signal has an amplitude proportional to the frequency deviation and the modulation signal can easily be recovered after a low-pass filter removes the signal components at multiples of the IF frequency.

Integration of FM detectors into semiconductor devices requires the use of accurate delay elements or filters with well controlled phase characteristics to generate the time-derivative approximation or else excessive DC offsets will occur.

Coincidence detectors in use today typically employ passive resonator components and a high-pass filter to provide the 90 degrees phase shift. The resonator circuit is often trimmed during production to provide low DC off-set.

Another detector variant in use when the FM-signal frequency (i.e. the IF signal) is high compared to the base-band signal is a digital detector based on a digital delay line (one or more latches) as differentiator. This delay line may be clocked by an accurate clock and hence result in a detector with an inherently low DC offset.

Another approach is to convert the analogue signal to a digital signal (A/D) and perform the FM detection in a digital signal processor DSP or other digital circuit.

In order to support on-chip intermediate frequency (IF) filters, it is convenient to use a low IF compared to the symbol rate (e.g. 3 MHz IF and 1 Msym/s symbol rate). This makes the use of a digital delay line impractical.

The most practical FM detector, when the IF frequency is just a few times the symbol rate, is a coincidence, or quadrature, detector, as illustrated in FIG 2. This detector requires three building blocks in addition to a post-detector low-pass filter (PDF); a multiplier 8, a delay element 9, and a 90° ($\pi/2$) phase shifter 10.

The delay element 9 delays the incoming signal by a predetermined time, the phase shifter 10 produces a 9020 phase shift in this delayed signal, and then the delayed and shifted signal is multiplied with the input signal by the multiplier 8. The multiplier 8 can be provided by an exclusive-OR gate, or by a NAND gate. This may mean that the incoming signals to the multiplier will need to be conditioned.

The 90° ($\pi/2$) coincidence-detector phase shifter 10 is typically implemented as a high-pass filter operating well below its corner frequency, hence providing near, but not quite, 90° phase shift but also severely attenuating the signal amplitude. In addition, the phase shift is not accurate and some returning of the delay element is needed to compensate for the finite phase error.

SUMMARY OF THE PRESENT INVENTION

According to one aspect of the present invention, there is provided a frequency modulated signal demodulator circuit including a phase shift element and a time delay element which operate on an input signal, wherein both the phase shift element and the time delay element are provided by a gyrator component.

According to a second aspect of the present invention, there is provided a demodulator circuit for demodulating a frequency modulated signal, the circuit comprising:

an input for receiving a frequency modulated input signal;

a gyrator which is connected to receive the modulated input signal and is operable to produce a gyrator output signal which is delayed and phase-shifted with respect to the input signal; and a multiplier which is connected to receive the input signal and gyrator output signal and is operable to produce an output signal equivalent to the product of those received signals.

DETAILED DESCRIPTION OF THE PREFERRED EMBODIMENT

Figure 1:
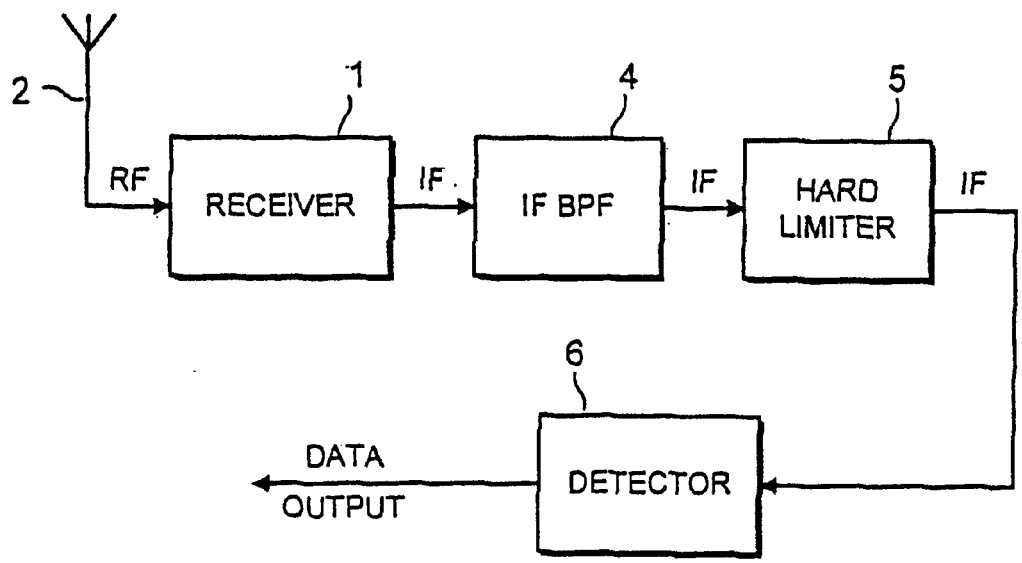
FIG. 1 shows a block diagram illustrating a circuit for receiving and demodulating a frequency modulated signal.
Figure 2:
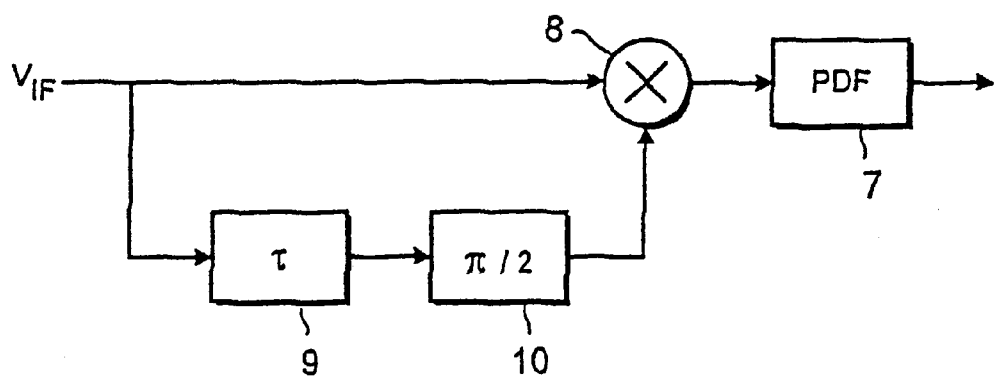
FIG. 2 shows a block diagram of a quadrature FM detector.

Current FM detectors have been described with reference to FIGS. 1 and 2.

Figure 3:
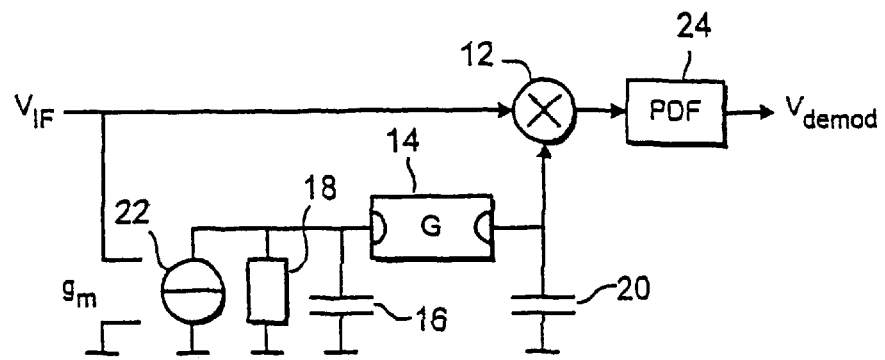
FIG. 3 shows a block diagram of a demodulator embodying the present invention.

A demodulator embodying the present invention for use in demodulating a frequency modulated signal is shown in FIG. 3 and comprises a multiplier 12 which is connected to receive an FM IF input signal at one input, and a gyrator 14. The input of the gyrator 14 is connected to receive the input signal, via a trans conductance device 22. A capacitor 16 and a resistor 18 are connected in parallel between the input of the gyrator 14 and ground. The capacitor 16 may be provided by the input capacitance of the gyrator, and so there may not necessarily be the need to have a separate capacitor in the circuit. A second capacitor 20 is connected between the output of the gyrator 14 and ground.

The output from the gyrator 14 is delayed in time and is shifted in phase with respect to the input signal. The multiplier 8 receives the delayed and shifted signal, and produces a demodulated output. Thus, the gyrator 14 provides the function of the delay and phase shift components described with reference to FIG. 2. A post detection filter 24 is used to provide the demodulated putput.

Figure 4:
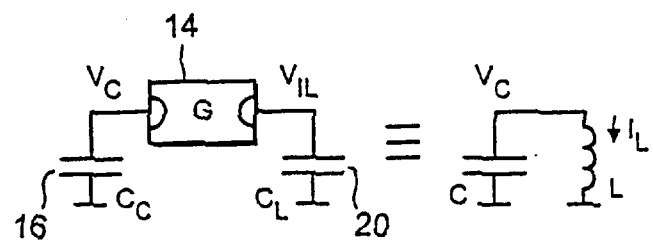
FIG. 4 illustrates a gyrator, and its equivalent circuit, for use in the circuit of FIG. 3.

FIG. 4 shows a gyrator and associated capacitors which provide the delay and phase shifting elements (or resonator) of FIG. 3. FIG. 4 also shows the equivalent circuit for the gyrator. Gyrators are described in more detail at pages 12–35 to 12–37 of "Electronics Engineers Handbook, 3rd Ed.", Fink and Christiansen, published by McGraw Hill, and at pages 266 and 267 of "The Art of Electronics, 2nd Ed.", Horowitz and Hill, published by Cambridge University Press.

The input port voltage ($V_C$) of the gyrator-based resonator corresponds to the, voltage, across the equivalent parallel LC resonator. The voltage at the other gyrator port ($V_{IL}$) corresponds to the inductor current. This inductor current, is nominally 90° out of phase with the capacitor (or input port) voltage. This phase shift is exploited in the demodulator to eliminate the need for a separate 90 degrees phase shifter.

Figure 5:
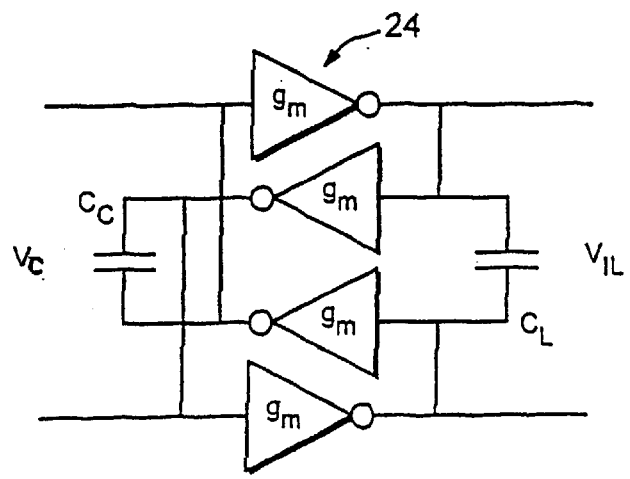
FIG. 5 illustrates a CMOS implementation of the gyrator of FIG. 4.

Furthermore, gyrators are conveniently implemented in CMOS technology, and one such implementation is illustrated in FIG. 5, Four transconductance elements 24, such as CMOS inverters, are used and are connected as shown in FIG. 5. Use of a CMOS implemented gyrator is especially useful as gyrators may also be used to implement the preceding IF filter. Hence the same building blocks may be used and their tuning will track with process variations. If the capacitors connected to the gyrator are equal in value ($C_C=C_L$) both capacitor voltages will peak at the resonator resonance frequency (i.e. the IF frequency) and have the same amplitude which will maximize the dynamic range.

The delay of the gyrator-based resonator is determined by its Q value. A resistor connected across $C_C$ will define the resonator Q value. If this resistor is implemented by means of a transconductance similar to the ones in the gyrator (e.g. a CMOS inverter) the Q value will be robust against process variations.

What is claimed is:

1. A frequency modulated signal demodulator circuit including a phase shift element and a time delay element which operate on an input signal, wherein both the phase shift element and the time delay element are provided by a gyrator component.

2. A demodulator circuit for demodulating a frequency modulated signal, the circuit comprising:

an input for receiving a frequency modulated input signal;

a gyrator which is connected to receive the modulated input signal and is operable to produce a gyrator output signal which is delayed and phase-shifted with respect to the input signal; and a multiplier which is connected to receive the input signal and gyrator output signal and is operable to produce an output signal equivalent to the product of those received signals.

3. A circuit as claimed in claim 2, wherein the gyrator is connected to receive the input signal via a resistive element and a capacitive element.

4. A circuit as claimed in claim 2, wherein the input terminal is connected to the input of the gyrator, a transconductance element, a resistive element and a capacitive element are connected in parallel with one another between the input terminal and a second input terminal, and the gyrator output is connected to the multiplier and to a capacitive element connected between the gyrator output and the second input terminal ground.

5. A circuit as claimed in claim 4, wherein the second input terminal is connected to ground.

6. A circuit as claimed in claim 3, wherein the capacitive element is provided by a capacitor device.

7. A circuit as claimed in claim 3, wherein the capacitive element is provided by input capacitance of the gyrator.

8. A circuit as claimed in claim 2, wherein the multiplier is provided by an exclusive-OR gate or a NAND gate.

* * * * *